United States Patent
Hinson et al.

(10) Patent No.: US 10,635,248 B2
(45) Date of Patent: Apr. 28, 2020

(54) FORCE SENSOR MOUNT AND RELATED HOUSINGS AND SYSTEMS THAT INCORPORATE THE SAME

(71) Applicant: Atmel Corporation, Chandler, AZ (US)

(72) Inventors: Nigel Hinson, Lymington (GB); Paul Clements, Meonstoke (GB)

(73) Assignee: Amtel Corporation, Chandler, AZ (US)

( * ) Notice: Subject to any disclaimer, the term of this patent is extended or adjusted under 35 U.S.C. 154(b) by 0 days.

(21) Appl. No.: 15/986,653

(22) Filed: May 22, 2018

(65) Prior Publication Data
US 2019/0212842 A1 Jul. 11, 2019

Related U.S. Application Data

(60) Provisional application No. 62/613,854, filed on Jan. 5, 2018.

(51) Int. Cl.
*G06F 3/044* (2006.01)
*G06F 3/041* (2006.01)
(Continued)

(52) U.S. Cl.
CPC ............ *G06F 3/044* (2013.01); *G01L 1/142* (2013.01); *G06F 3/04142* (2019.05);
(Continued)

(58) Field of Classification Search
CPC .......... G06F 3/044; G06F 2203/04105; H05K 1/181; H05K 5/0008; H05K 2201/10151; H05K 2201/10265; H05K 2201/10409
See application file for complete search history.

(56) References Cited

U.S. PATENT DOCUMENTS

| 5,488,873 A | 2/1996 | Delmas et al. |
| 7,148,882 B2 | 12/2006 | Kamrath et al. |

(Continued)

FOREIGN PATENT DOCUMENTS

| CN | 101918909 A | 12/2010 |
| CN | 102193699 A | 9/2011 |

(Continued)

OTHER PUBLICATIONS

International Search Report for International Application No. PCT/IB2019/050076, dated Apr. 29, 2019, 4 pages.
(Continued)

*Primary Examiner* — Amare Mengistu
*Assistant Examiner* — Crystal Mathews
(74) *Attorney, Agent, or Firm* — TraskBritt

(57) ABSTRACT

Assemblies include a chassis having a first side configured to receive a force-sensitive surface, a support structure including first electrode portions, and resilient mounting elements attached to the chassis and to the support structure. The mounting elements include second electrode portions positioned adjacent to the first electrode portions. Force-sensitive systems include force sensors including portions of a support structure and portions of a mounting element that are adapted to relatively move responsive to one or more applied forces, and a controller configured to identify the one or more applied forces by determining movement between the support structure and the mounting element. Methods include detecting changes in capacitances of respective capacitors formed by first electrode portions on a support structure and second electrode portions defined by mounting elements coupling a chassis to the support structure. Force values and force locations are determined from the detected changes in capacitances.

27 Claims, 6 Drawing Sheets

(51) Int. Cl.
    *H04M 1/02* (2006.01)
    *G01L 1/14* (2006.01)
    *H05K 1/18* (2006.01)
    *H05K 5/00* (2006.01)
(52) U.S. Cl.
    CPC ..... *H04M 1/02* (2013.01); *G06F 2203/04105* (2013.01); *H05K 1/181* (2013.01); *H05K 5/0008* (2013.01); *H05K 2201/10151* (2013.01); *H05K 2201/10265* (2013.01); *H05K 2201/10409* (2013.01)

(56) References Cited

U.S. PATENT DOCUMENTS

| | | | |
|---|---|---|---|
| 7,183,948 | B2 | 2/2007 | Roberts |
| 8,169,332 | B2 | 5/2012 | Son |
| 9,262,002 | B2 | 2/2016 | Momeyer et al. |
| 9,563,317 | B2 | 2/2017 | Sleeman et al. |
| 2003/0214485 | A1* | 11/2003 | Roberts ................ G06F 3/0414 345/173 |
| 2004/0156168 | A1 | 8/2004 | LeVasseur et al. |
| 2005/0057527 | A1 | 3/2005 | Takenaka et al. |
| 2009/0243817 | A1 | 10/2009 | Son |
| 2010/0253645 | A1* | 10/2010 | Bolender ............. G06F 3/0414 345/174 |
| 2011/0128239 | A1 | 6/2011 | Polyakov et al. |
| 2011/0227866 | A1 | 9/2011 | Kawaguchi et al. |
| 2013/0342501 | A1 | 12/2013 | Molne et al. |
| 2014/0002113 | A1 | 1/2014 | Schediwy et al. |
| 2015/0138112 | A1* | 5/2015 | Campbell ............. G06F 3/0414 345/173 |
| 2015/0160783 | A1 | 6/2015 | Kaneko et al. |
| 2015/0301642 | A1* | 10/2015 | Hanauer ................ G06F 3/0414 345/174 |
| 2016/0291761 | A1 | 10/2016 | Huie |
| 2017/0102809 | A1 | 4/2017 | Son et al. |
| 2018/0035551 | A1* | 2/2018 | Woo ........................ F16B 43/004 |
| 2018/0081479 | A1* | 3/2018 | Kravets ................... G06F 3/016 |
| 2019/0033923 | A1* | 1/2019 | Wang ..................... G06F 3/0202 |

FOREIGN PATENT DOCUMENTS

| | | |
|---|---|---|
| CN | 105009048 A | 10/2015 |
| EP | 0531815 A1 | 3/1993 |
| EP | 1464939 A | 10/2004 |
| WO | 2008/076393 A1 | 6/2008 |

OTHER PUBLICATIONS

International Written Opinion for International Application No. PCT/IB2019/050076, dated Apr. 29, 2019, 9 pages.
Taiwanese Search Report and Office Action from Taiwanese Application No. 108100380, dated Dec. 6, 2019, 20 pages, with English Translation.

* cited by examiner

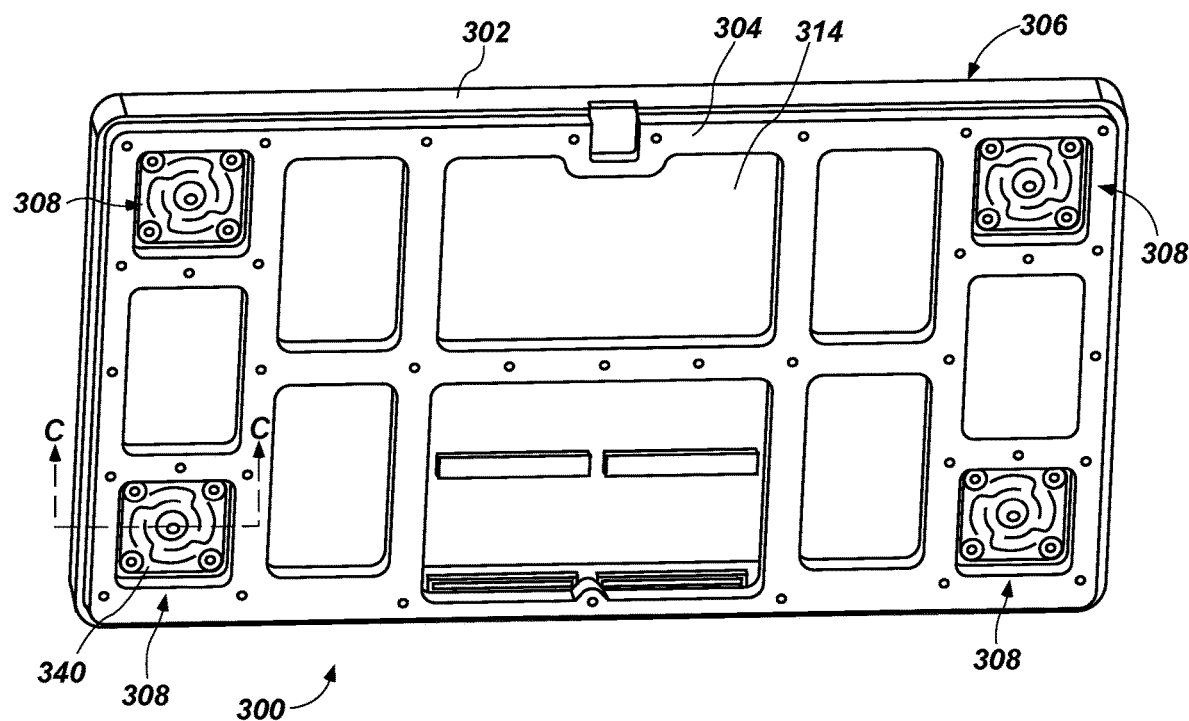
FIG. 7
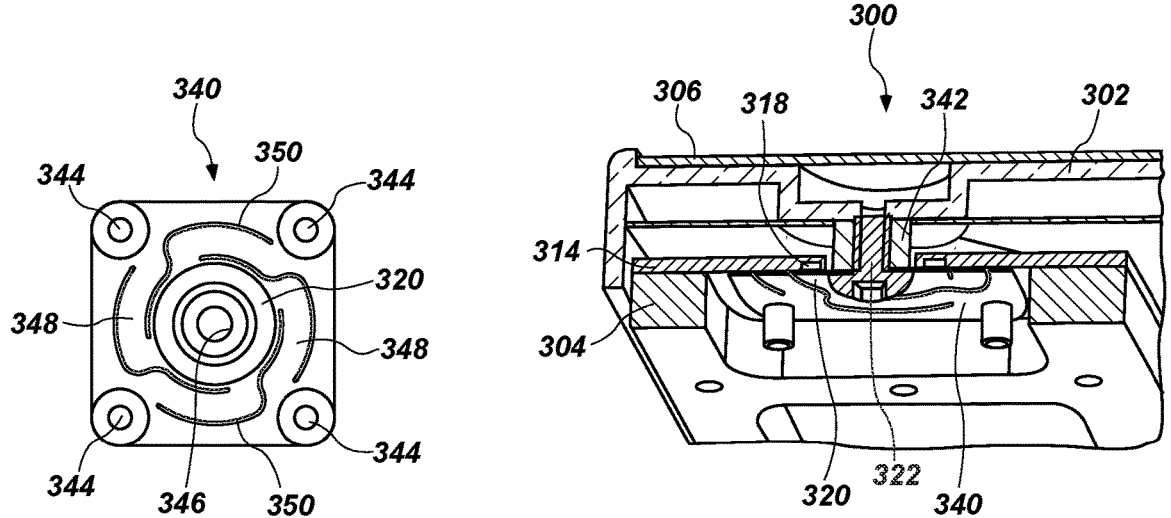
FIG. 8
FIG. 9

FORCE SENSOR MOUNT AND RELATED HOUSINGS AND SYSTEMS THAT INCORPORATE THE SAME

CROSS-REFERENCE TO RELATED APPLICATION

This application claims the benefit under 35 U.S.C. § 119(e) of U.S. Provisional Patent Application Ser. No. 62/613,854, filed Jan. 5, 2018, the disclosure of which is hereby incorporated herein in its entirety by this reference.

FIELD

The embodiments described herein relate, generally, to mounting capacitive force sensors and systems including mounted capacitive force sensors. For example, certain disclosed embodiments relate to systems including touchscreens with force-sensing capabilities.

BACKGROUND

Touch-sensitive surfaces (e.g., touchscreens) are incorporated into many products and systems, and sub-systems, such as automobiles, telephones, machinery, tablet computers, mobile phones, personal computers, etc. Common types of touchscreens include capacitive touchscreens and resistive touchscreens, among others. Capacitive touchscreens may include a transparent conductor coating an insulator, such as glass. When a human finger (which is electrically conductive) touches a capacitive touchscreen, the screen's electrostatic field may be distorted and detected as a change in capacitance. Conventional capacitive touchscreens are limited in their ability to detect touches from non-conductive objects, such as fingers covered with non-conductive gloves. Resistive touchscreens may include two transparent, electrically resistive layers with a gap between the two layers. When a sufficient force is applied, the two layers may touch each other in the location of the force application, and the touch may be electrically sensed.

Some touchscreens incorporate force-sensing. Such "force-sensitive" screens include sensors incorporated into the display screen to measure incremental differences in a distance between the screen and a feature beneath the screen. However, such force-sensitive screens may be difficult and expensive to integrate into touchscreens.

BRIEF SUMMARY

In some embodiments, assemblies include a chassis, a support structure, and resilient mounting elements. The chassis includes a first side configured to receive a force-sensitive surface. The support structure includes first electrode portions. The resilient mounting elements are attached to the chassis and to the support structure. The resilient mounting elements are positioned to allow relative movement between the chassis and support structure. The resilient mounting elements respectively include second electrode portions, the second electrode portions positioned adjacent to the first electrode portions.

In some embodiments, methods of estimating a force applied to a force-sensitive surface include detecting changes in capacitances of respective capacitors formed by first electrode portions on a support structure and second electrode portions defined by mounting elements. The mounting elements couple a chassis receiving a force-sensitive surface to the support structure. The methods also include using the detected changes in capacitances to determine a force value of a force applied to the force-sensitive surface and comparing the changes in capacitances of the respective capacitors to estimate a location of the force applied to the force-sensitive surface.

In some embodiments, force-sensitive systems include a chassis having a first side, force sensors, and a controller. The force sensors include portions of a support structure and portions of a mounting element, the portions of the support structure and the portions of the mounting element adapted to move closer and/or apart responsive to one or more forces applied to the first side. The controller is supported by the support structure and configured to identify one or more forces applied to the first side by determining movement between the portions of the support structure and the portions of the mounting element.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 7 is a bottom view of a system including capacitive force sensors according to another embodiment of this disclosure.

FIG. 8 is a plan view of a resilient mounting element of the system of FIG. 7.

FIG. 9 is a partial cross-sectional view of the system of FIG. 7, taken through line C-C of FIG. 7.

DETAILED DESCRIPTION

The illustrations presented in this disclosure are not meant to be actual views of any particular system or component thereof, but are merely idealized representations employed to describe illustrative embodiments. Thus, the drawings are not necessarily to scale.

As used herein, relative terms such as "downward," "upward," "lower," "upper," "above," etc., are used for clarity and convenience in understanding the disclosure and accompanying drawings and does not connote or depend on any specific preference, orientation, or order, except where the context clearly indicates otherwise. For example, "downward" refers to downward with respect to the drawings and to an orientation of the disclosed system when it is placed on a horizontal surface. However, the disclosed system may also be used when affixed to a vertical surface (e.g., a wall), an angled surface, or in any other orientation.

Disclosed embodiments relate, generally, to techniques for touch- and/or force-sensitive systems and assemblies including capacitive force sensors. For example, disclosed are embodiments of systems that include a chassis including a first side configured to receive a force-sensitive surface (e.g., a touchpad, a back plate, a side of a housing, a touchscreen (e.g., a liquid crystal display ("LCD") screen), etc.) and a support structure, which may be a lower chassis and may include a printed circuit board ("PCB"), with resilient mounting elements (e.g., strip springs) positioned to allow movement of the chassis relative to the support structure. The mounting elements may be located near corners of the system. First electrode portions of respective capacitors may be positioned on the support structure (e.g., on the PCB) adjacent to the mounting elements, and the mounting elements may each be or include an electrically conductive material (e.g., copper, spring steel, etc.) configured as second electrode portions of the capacitors. In one embodiment, one or more portions of PCBs, including portions adjacent to mounting elements, may comprise electrode portions of a capacitor. An initial air gap may be present between the first electrode portions and second electrode portions, when no external force is applied to the first side of the chassis. As relative movement between the chassis and support structure occurs, a distance between the first electrode portions and the second electrode portions may change, providing a measurable and/or detectable change in capacitance. The change in capacitance may be detected and used to estimate a force applied to a force-sensitive surface supported by the chassis. The location of the applied force on the force-sensitive surface may also be estimated by comparing changes in capacitance at the multiple mounting elements of the system.

Figure 1:
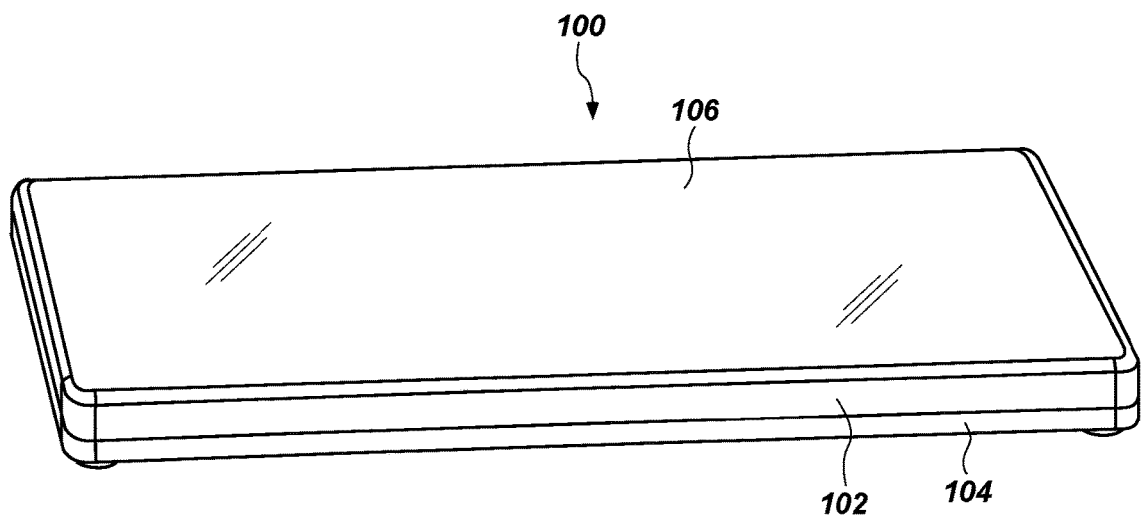
FIG. 1 is a perspective view of a system including capacitive force sensors according to an embodiment of this disclosure.

Referring to FIG. 1, a perspective view of a touch- and force-sensitive system 100 (also referred to simply as "system 100") is shown. The system 100 includes a chassis 102 and a support structure 104. The chassis 102 may include a first surface (e.g., a touchpad, back plate, touchscreen, a side of a housing, etc.) 106, such as a liquid crystal display ("LCD") screen including a touchscreen panel positioned thereon. At least portions of the chassis 102 and support structure 104 may be positioned at an initial distance from each other (i.e., in a state when no external force is applied to the first surface 106). When an external force is applied to the first surface 106, the distance between the chassis 102 and support structure 104 may be reduced, at least in an area where the external force is applied. Internal features, described below with reference to FIGS. 2-4, may be configured to estimate a force value and/or location of the external force applied to the first surface 106.

Figure 2:
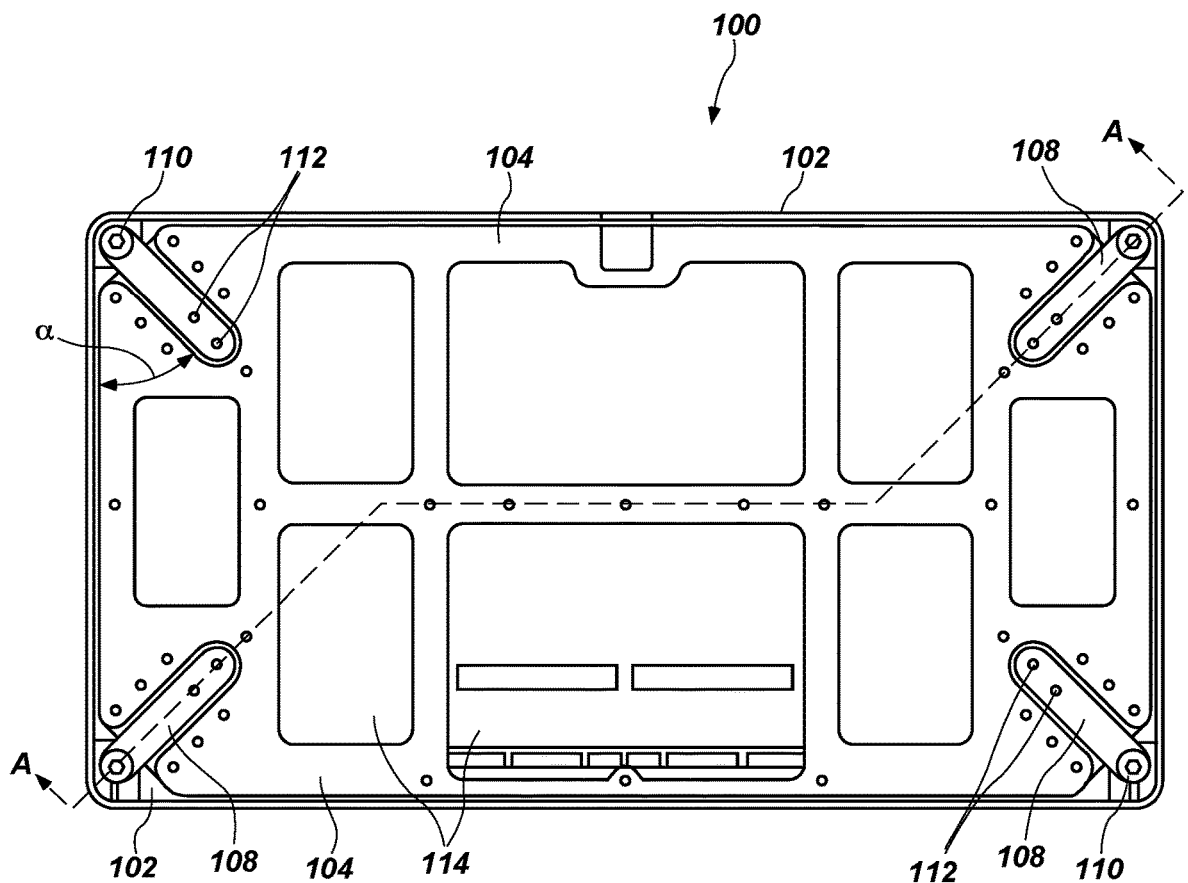
FIG. 2 is a bottom view of the system of FIG. 1, with a lower portion removed for easier visibility of internal features.

FIG. 2 is a bottom view of the system 100 of FIG. 1, with a lower portion of the support structure 104 removed for easier visibility of internal features. Resilient mounting elements, which are in the form of strip springs 108 in the embodiment of the system 100 shown in FIG. 2, may be attached to the chassis 102 and to the support structure 104. The strip springs 108 may couple the chassis 102 to the support structure 104. For example, outer fasteners 110 (e.g., bolts, rivets, screws, a conductive adhesive material, etc.) may attach the strip springs 108 to the chassis 102. Inner fasteners 112 (e.g., bolts, rivets, screws, an adhesive material, etc.) may attach the strip springs 108 to the support structure 104. For example, the support structure 104 may be or include a printed circuit board ("PCB") 114 to which the strip springs 108 are attached. By way of example, two inner fasteners 112 may attach each strip spring 108 to the PCB 114. The strip springs 108 may each be located near a respective corner of the system 100. For example, the outer fasteners 110 may each be located inside the corners of the system 100, such as within about 1 inch (e.g., within about 0.5 inch or within about 0.25 inch) from the outer peripheral corners of the system 100. The strip springs 108 may extend from the outer fasteners 110 near the corners of the system 100 toward a central region of the system 100. By way of non-limiting example, the strip springs 108 may extend inward from the outer fasteners 110 at an angle α of about 45 degrees from a peripheral edge of the chassis 102, as shown in FIG. 2. In some embodiments, the strip springs 108 may extend inward from the outer fasteners 110 at an angle α of between about 30 degrees and about 60 degrees from the peripheral edge of the chassis 102.

The strip springs 108 may be configured as a single, generally flat and rectangular strip of material. In some embodiments, the strip springs 108 may be or include an electrically conductive metal material, such as a spring steel or copper. In other embodiments, the strip springs 108 may include an electrically conductive material on an upper surface thereof (i.e., a surface on a side of the strip springs 108 facing a lower side of the PCB 114). The strip springs 108 may be configured and positioned to deflect an outer portion (e.g., an outer end portion) thereof downwardly away from the PCB 114 upon application of an external force to the first surface 106, which external force may be transmitted to the strip springs 108 by the outer fasteners 110. Alternatively or additionally, the outer portions of the strip springs 108 may be adapted to move closer to the PCB 114, depending on the configuration and mounting of the strip springs 108 and/or on the location, direction, and magnitude of force applied to the first surface 106. The strip springs 108 may have material properties (e.g., stiffness, modulus of elasticity, etc.), a thickness, a width, and a length that may be selected to provide a desired deflection response, such as based on a mass of the chassis 102 and on expected applied external forces. One of ordinary skill in the art may be capable of making these selections for a given configuration of the system 100.

Figure 3A:
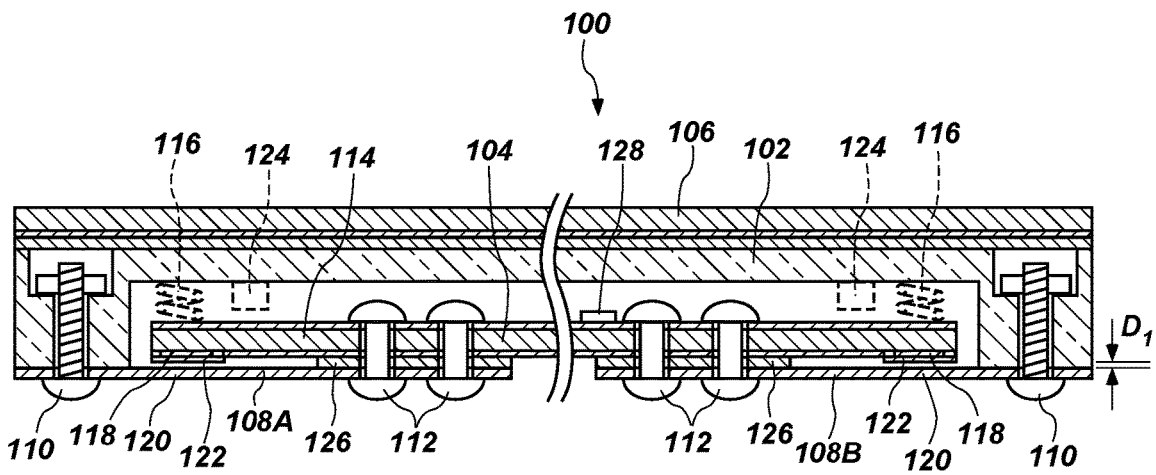
FIG. 3A is a partial cross-sectional view of the system of FIG. 1 taken through line A-A of FIG. 2, and showing the system at a state of rest.

FIG. 3A is a partial cross-sectional view of the system 100 taken through line A-A of FIG. 2, and showing the system 100 at an initial state of rest, with no external force applied to the first surface 106. A lower portion of the support structure 104 is not shown in FIG. 3A, for clarity and simplicity. Illustrated are a first strip spring 108A and a second strip spring 108B, collectively referred to as strip springs 108, which are located at opposing corners of the system 100. Some deflection of the strip springs 108 downward may occur in the initial state, due to gravity acting downward on the mass of the chassis 102. Optionally, the strip springs 108 may, when outside of the system 100, be pre-curved upward to at least partially counteract the initial deflection due to the gravity acting downward on the chassis 102. An alternative or additional option is to include at least one biasing element 116 (shown in FIG. 3A in dashed lines; e.g., a coil spring) positioned between the chassis 102 and the support structure 104 (e.g., the PCB 114 of the support structure 104) to at least partially counteract initial deflection of the strip springs 108 that may occur due to the gravity acting downward on the chassis 102. The at least one biasing element 116, if present, may be adapted to maintain gaps initially defined between the PCB 114 and the respective strip springs 108. Such optional features may be included in some embodiments (e.g., to accommodate a relatively more massive chassis 102), while other embodiments (e.g., including a relatively less massive chassis 102 and first surface 106, a system 100 to be mounted vertically, etc.) may lack pre-curved strip springs 108 and/or the at least one biasing element 116.

The PCB 114 may include first electrode portions 118 positioned proximate to and above each of the strip springs 108. The strip springs 108 may be or include an electrically conductive metal material, which may act as second electrode portions 120. The first electrode portions 118 and the second electrode portions 120 may form a capacitor at each of the strip springs 108. The first electrode portions 118 may be configured (e.g., sized and shaped) to result in a known and/or predetermined capacitive response. An insulator 122 may be positioned between each of the first electrode portions 118 and second electrode portions 120 as a dielectric layer to impede current flow between the first electrode portions 118 and respective second electrode portions 120. For example, the insulators 122 may be positioned directly on the respective first electrode portions 118, as shown in FIG. 3A, and/or directly on the respective second electrode portions 120. Air filling the gap between the first electrode portions 118 and second electrode portions 120 may also impede current flow and act as a dielectric layer. The at least one inner fastener 112 may be or include an electrically conductive material, and may be electrically coupled to both the second electrode portions 120 (e.g., the strip springs 108) and circuitry of the PCB 114. The circuitry of the PCB 114 may also be electrically coupled to the first electrode portions 118. The circuitry of the PCB 114 may be configured to detect a change in capacitance between the respective first electrode portions 118 and second electrode portions 120 as outer portions of the strip springs 108 are deflected away from and/or toward the PCB 114, such as resulting from an external force applied to the first surface 106. By way of example, the circuitry of the PCB 114 may be configured to detect the change in self-capacitance and/or mutual capacitance. The circuitry of the PCB 114 may be coupled to a controller 128 (e.g., a microcontroller, configurable state machine, field-programmable gate array, application specific integrated circuit, etc.) that is configured to measure and detect capacitance changes upon relative movement between the strip springs 108 and the corresponding first electrode portions 118. The controller 128 may be further configured to estimate a force value (e.g., a magnitude, a value corresponding to a magnitude, etc.) and/or location of an external force application on the first surface 106, as explained below. The controller 128 may be positioned on and electrically coupled to the PCB 114 and to the first electrode portions 118 and second electrode portions 120.

Optionally, protrusions 124 (shown in FIG. 3A in dashed lines) may extend from the chassis 102 toward the support structure 104. The protrusions 124 may be configured to abut against the support structure 104 (e.g., against the PCB 114 of the support structure 104) when a sufficient external force is applied to the first surface 106, to limit relative movement between the chassis 102 and the support structure 104. For example, a maximum deflection of the strip springs 108 may be preselected, such as to avoid permanent (e.g., plastic) deformation of the strip springs 108. The size and position of the protrusions 124 may be selected to abut against the support structure 104 upon reaching the preselected maximum deflection of the strip springs 108. For example, the protrusions 124 may be initially positioned at a distance of between about 0.1 mm and about 0.5 mm, such as about 0.2 mm, from the PCB 114, the distance being approximately equal to the preselected maximum deflection. The protrusions 124 may, in some embodiments, be positioned on the chassis 102 adjacent to (e.g., over) the locations of the strip springs 108. In some embodiments, the protrusions 124 may be adjustable, such as by configuring the protrusions as screws. In some embodiments, the protrusions 124 may extend from the support structure 104 toward the chassis 102, rather than or in addition to from the chassis 102 toward the support structure 104.

In some embodiments, spacers 126 may be positioned between the respective strip springs 108 and the PCB 114, to provide an initial gap between the strip springs 108 and the insulators 122 and/or first electrode portions 118. By way of example and not limitation, the strip springs 108 may be located an initial distance $D_1$ (i.e., when no external force is applied to the first surface 106) that is between about 0.01 mm and about 0.2 mm. The initial distance $D_1$ between the first electrode portions 118 and the second electrode portions 120 may result in an initial capacitance at each of the strip springs 108 that may be detected and measured by the circuitry of the PCB 114. The initial capacitance may be a baseline or tare, which may be later compared to measured capacitances when an external force is applied to the first surface 106 for estimating a force value and/or a location of the applied external force, as explained below.

Figure 3B:
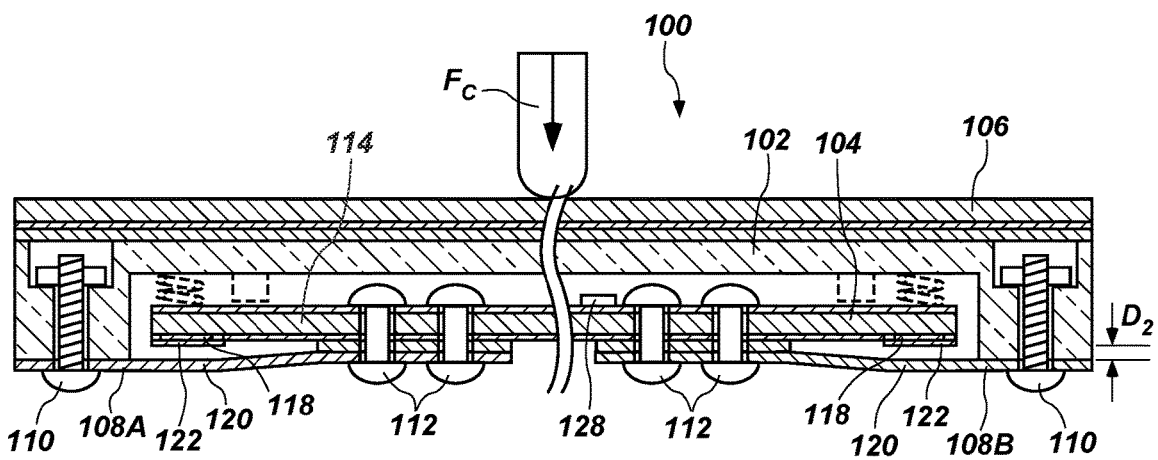
FIG. 3B is a partial cross-sectional view of the system like FIG. 3A, but showing the system with an applied central force.

FIG. 3B is a partial cross-sectional view of the system 100 like FIG. 3A, but showing the system 100 with an applied central force $F_C$. A lower portion of the support structure 104 is not shown in FIG. 3B, for clarity and simplicity. The central force $F_C$ may be an external force applied on the first surface 106 approximately midway between the first strip spring 108A and the second strip spring 108B, in a direction toward the support structure 104. The central force $F_C$ may be transmitted through the outer fasteners 110 to the strip springs 108, causing outer portions of the strip springs 108 to deflect downward and away from the PCB 114. Because the central force $F_C$ is applied approximately midway between the first strip spring 108A and the second strip spring 108B, a distance $D_2$ between the first strip spring 108A and the corresponding first electrode portion 118 may be approximately the same as a distance $D_2$ between the second strip spring 108B and the corresponding second electrode portion 120. As a result, capacitances at the first strip spring 108A and at the second strip spring 108B may be approximately the same.

Thus, by detecting and measuring the capacitances at the strip springs 108 with the PCB 114, the controller 128 may be configured to identify a force value and/or location of the central force $F_C$. A value of the capacitances may be inversely correlated to a distance between the electrode portions 118, 120, and a force value of the central force $F_C$ may be calculated by the controller by determining a change in capacitance, calculating a change in distance, and correlating the change in distance to a force. For example, if the change in capacitance at the first strip spring 108A is approximately equal to the change in capacitance at the second strip spring 108B, and the capacitances are reduced from the initial capacitance when no force is applied, then the controller 128 may determine that the applied central force $F_C$ is toward the support structure 104 and approximately midway between the first strip spring 108A and second strip spring 108B. For example, the force used to deflect each strip spring 108 may be calculated by the controller based on the material properties of the strip spring 108 (e.g., modulus of elasticity, cross-sectional area and shape, etc.) and the measured change in capacitance, which is inversely proportional to the distance $D_2$ when deflected by the central force $F_C$. The forces deflecting each of the strip springs 108 may be added together to determine the force value of the central force $F_C$.

Figure 3C:
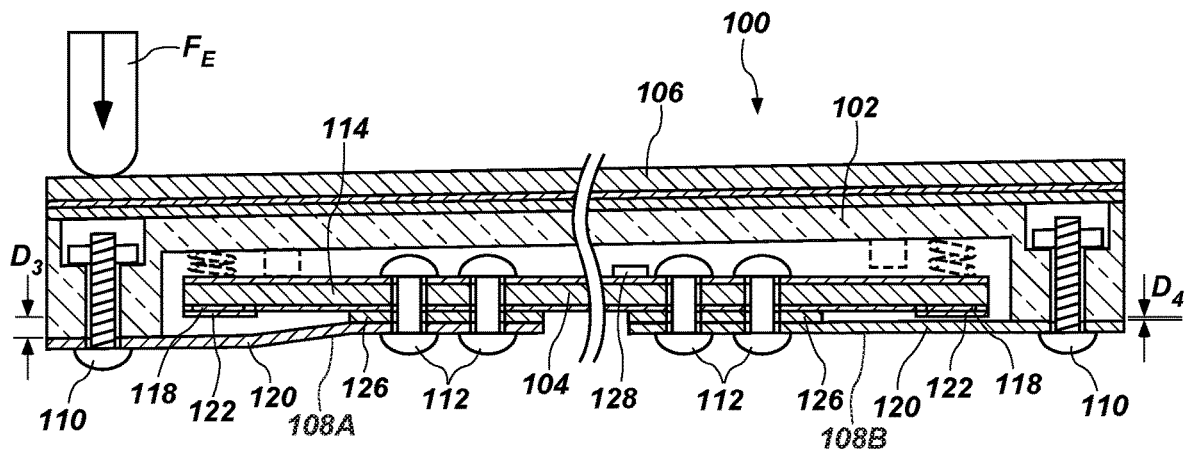
FIG. 3C is a partial cross-sectional view of the system like FIG. 3A, but showing the system with an applied edge force.

FIG. 3C is a partial cross-sectional view of the system 100 like FIG. 3A, but showing the system 100 with an applied edge force $F_E$. A lower portion of the support structure 104 is not shown in FIG. 3C, for clarity and simplicity. The edge force $F_E$ may be an external force applied on the first surface 106 near an edge of the first surface 106 adjacent to the first strip spring 108A, in a direction toward the support structure 104. The edge force $F_E$ may be transmitted through the outer fasteners 110 to the strip springs 108, causing outer portions of the strip springs 108 to deflect relative to the PCB 114. Because the edge force $F_E$ is applied near the edge of the first surface 106 adjacent to the first strip spring 108A, the outer portion of the first strip spring 108A may deflect downward and away from the PCB 114 to result in a distance $D_3$ between the first strip spring 108A and the corresponding first electrode portion 118. On the other hand, the outer portion of the second strip spring 108B may be located a distance $D_4$ from the corresponding first electrode portion 118 as a result of the edge force $F_E$. Because the location where the edge force $F_E$ is applied is relatively distant from the second strip spring 108B, the distance $D_4$ between the second strip spring 108B and the corresponding first electrode portion 118 may be less than the distance $D_3$ between the first strip spring 108A and the corresponding first electrode portion 118. In some embodiments, the distance $D_4$ may be approximately equal to the initial distance $D_1$ when no external force is applied to the first surface 106 (see FIG. 3A). In some embodiments, the distance $D_4$ may be less than the initial distance $D_1$, based on the outer portion of the second strip spring 108B deflecting upward toward the PCB 114 due to pivoting of the first surface 106 and chassis 102 about the inner fasteners 112. The spacers 126 may be provided to enable movement of the strip springs 108 upward toward the respective first electrode portions 118 in this fashion.

Accordingly, when the edge force $F_E$ is applied as illustrated at FIG. 3C, a capacitance at the first strip spring 108A may be reduced from an initial (i.e., when no external force is applied) capacitance, while a capacitance at the second strip spring 108B may be the same as or increased from the initial capacitance. By comparing the changes in capacitances at the various strip springs 108 with each other, the controller 128 may determine an approximate location of the edge force $F_E$, or of another external force applied at any location on the first surface 106.

The system 100 may be configured to calculate a center of mass for the applied force(s) along with a total calculated force. For a single force, the system 100 may calculate the position and applied force without using an additional touch sensor or touch pad. For multi-touch (i.e., sensing of forces simultaneously applied in two or more locations), an additional touch sensor or pad may be used on or in conjunction with the first surface 106 to determine locations of the applied forces. The finger positions determined by the touchscreen or pad and the calculated center of mass and total calculated force determined by the changes in capacitances at the strip springs 108 may be used by the controller 128 to determine the locations and forces of the individual applied forces.

Figure 4:
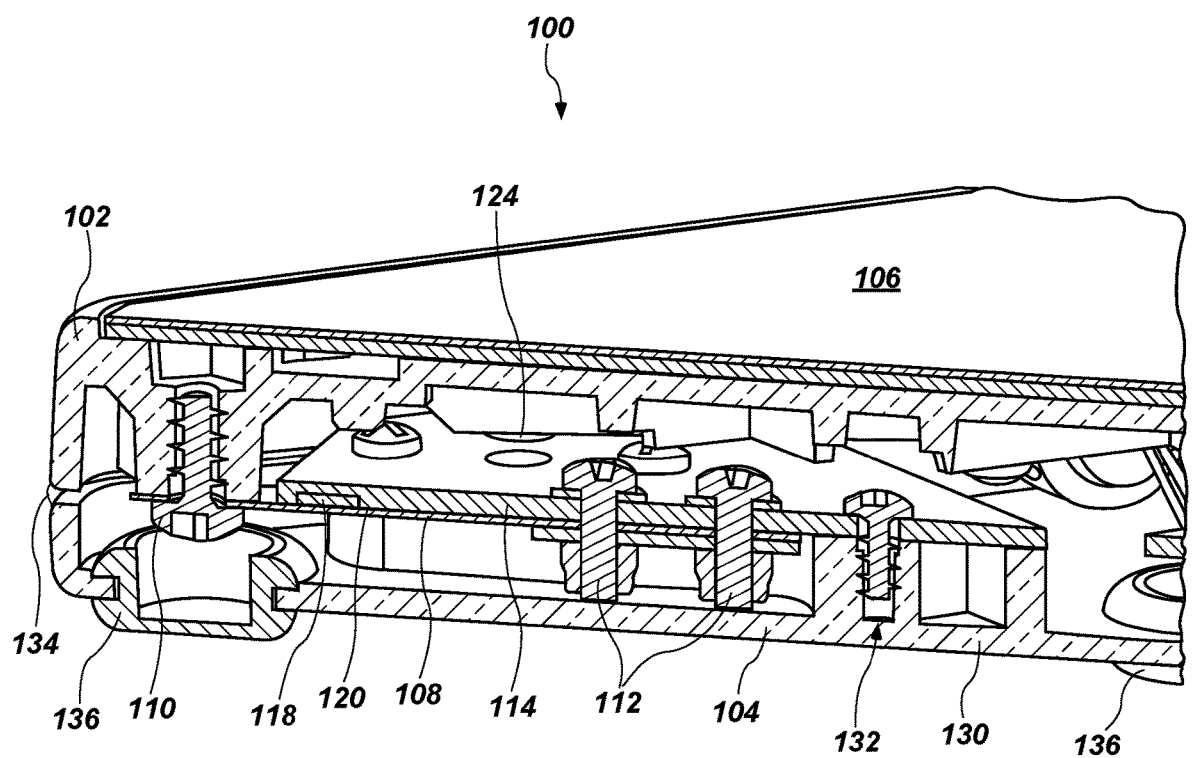
FIG. 4 is a partial cross-sectional view of the system of FIG. 1, taken through line A-A of FIG. 2, and including the lower portion.

FIG. 4 is a partial cross-sectional view of the system 100 taken through line A-A of FIG. 2 and including a lower portion 130 of the support structure 104. The lower portion 130 of the support structure 104 may be rigidly connected to the PCB 114 through connection structure 132. The connection structure 132 may include a fastener (e.g., a screw, a bolt, an adhesive, etc.). As shown in FIG. 4, peripheral edge portions of the chassis 102 and of the support structure 104 may be separated from each other an initial distance. The initial distance may be greater than the predetermined maximum deflection of the strip springs 108, described above. In some embodiments, a gap between the peripheral edge portions may be covered by a flexible seal element 134, to reduce or prevent debris from being introduced into a space between the chassis 102 and the support structure 104. Support elements 136 may protrude downward from the lower portion 130 of the support structure 104, such as to support the system 100 on a surface (e.g., on a table). Alternatively or additionally, the support structure 104 may be secured to a surface, such as with one or more fasteners.

Figure 5:
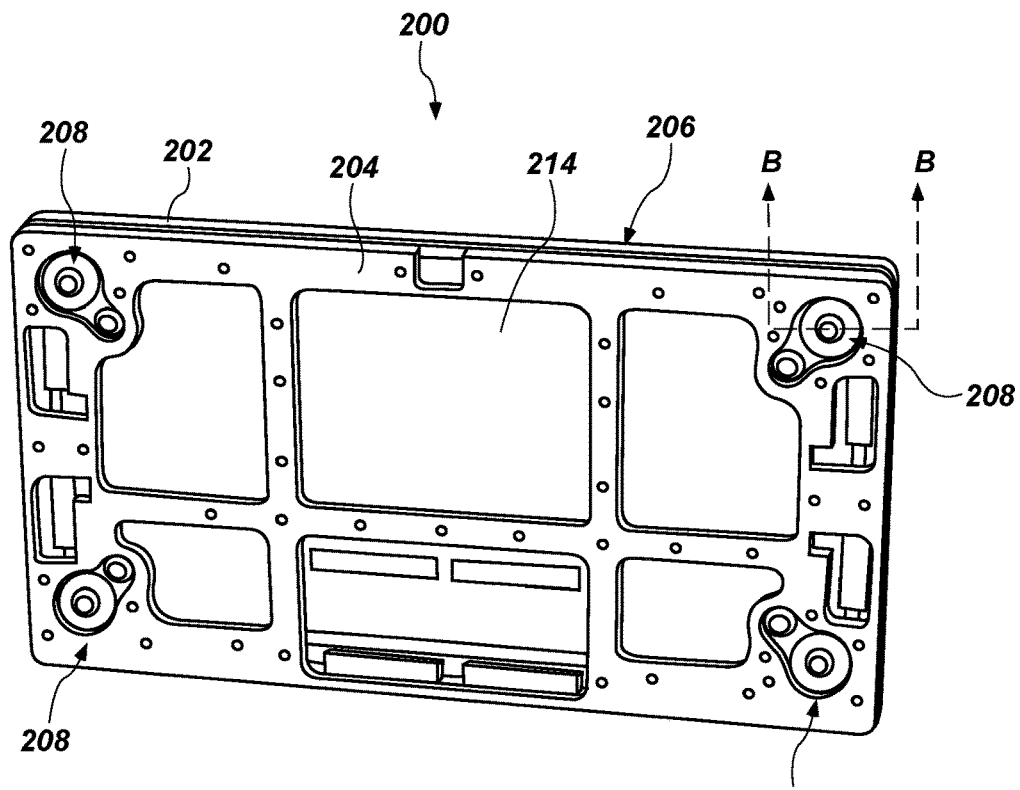
FIG. 5 is a bottom view of a system including capacitive force sensors according to another embodiment of this disclosure.
Figure 6:
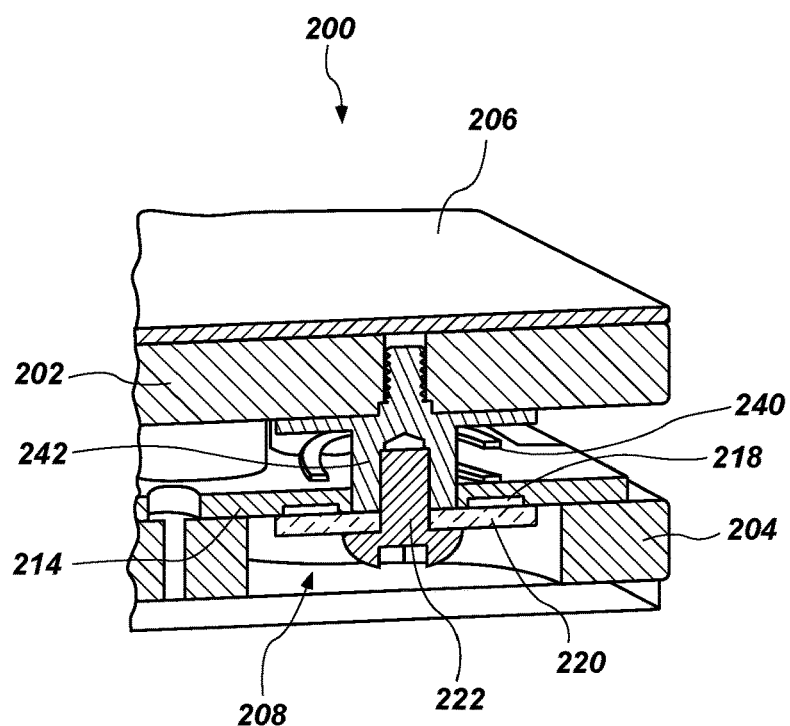
FIG. 6 is a partial cross-sectional view of the system of FIG. 5, taken through line B-B of FIG. 5.

Referring to FIGS. 5 and 6, another embodiment of a touch- and force-sensitive system 200 (also referred to simply as "system 200") is illustrated. The system 200 may be similar to the system 100 described above, in that the system 200 may include a chassis 202, a support structure 204 (e.g., including a PCB 214), and a first surface 206 (e.g., a touchpad, back plate, touchscreen, a side of a housing, an LCD screen including a touchscreen panel positioned thereon, etc.) of the chassis 202. The chassis 202 and the support structure 204 may be movable relative to each other. Proximate each corner of the system 200 may be a resilient mounting element 208.

In the embodiment of the system 200 shown in FIGS. 5 and 6, the resilient mounting elements 208 may each include a helical spring 240 laterally surrounding a post 242. A first end portion of the post 242 may be rigidly coupled to the chassis 202. The helical spring 240 may be positioned between an internal surface of the chassis 202 and the support structure 204 (e.g., a portion of the PCB 214). The PCB 214 may include a first electrode 218, which may be circular in shape and which may be positioned to laterally surround the post 242. A second end portion of the post 242 opposite the first end portion may be coupled to a second electrode 220, such as via a bolt 222. The second electrode 220 may be in the form of a conductive (e.g., metallic) washer. The post 242 may pass through a cutout in the PCB 214.

In operation, when a force of sufficient magnitude is applied to the first surface 206 (e.g., downward in the perspective of FIG. 6), the helical spring 240 may compress and the post 242 and second electrode 220 may move in a direction toward the support structure 204 (e.g., downward in the perspective of FIG. 6). A distance between the first electrode 218 and the second electrode 220 may increase, resulting in a measurable change in capacitance. When the force is released, the helical spring 240 may return the second electrode 220 to an initial position relative to the first electrode 218. Likewise, the capacitance between the first and second electrodes 218, 220 may return to its initial value. As discussed above, the changes in capacitance may be measured to determine (e.g., estimate) a presence, location, and/or magnitude of the force applied to the first surface 206.

Referring to FIGS. 7-9, another embodiment of a touch- and force-sensitive system 300 (also referred to simply as "system 300") is illustrated. The system 300 may be similar to the system 100 described above, in that the system 300 may include a chassis 302, a support structure 304 (e.g., including a PCB 314), and a first surface 306 (e.g., a touchpad, back plate, touchscreen, a side of a housing, an LCD screen including a touchscreen panel positioned thereon, etc.) of the chassis 302. The chassis 302 and the support structure 304 may be movable relative to each other. Proximate each corner of the system 300 may be a resilient mounting element 308.

In the embodiment of the system 300 shown in FIGS. 7-9, the resilient mounting elements 308 may each include a planar spring element 340 coupled to a post 342. A first end portion of the post 342 may be rigidly coupled to the chassis 302. The PCB 314 may include a first electrode 318 (FIG. 9), which may be circular in shape and which may be positioned to laterally surround the post 342. A second end portion of the post 342 opposite the first end portion may be coupled to the planar spring element 340, such as via a bolt 322. The planar spring element 340 may be or include a second electrode 320. The second electrode 320 may be in the form of a conductive (e.g., metallic) washer attached to the planar spring element 340, or may be an integral portion of the planar spring element 340. The post 342 may pass through a cutout in the PCB 314.

As shown in FIG. 8, an outer region of the planar spring element 340 may include outer support elements 344 (e.g., holes) for aligning and coupling the planar spring element 340 to the PCB 314, such as by using bolts or posts. A central region of the planar spring element 340 may include an attachment feature 346 (e.g., a hole) for coupling to the post 342, and the second electrode 320 (which may be an integral portion of the planar spring element 340) proximate to and surrounding the attachment feature 346. An intermediate region of the planar spring element 340 between the central region and the outer region may include resilient portions 348. The resilient portions 348 may include material of the planar spring element 340 defined by slits 350. By way of example, the slits 350 may be formed by laser engraving, waterjet cutting, milling, or stamping.

In operation, when a force of sufficient magnitude is applied to the first surface 306 (e.g., downward in the perspective of FIG. 9), the post 342 and second electrode 320 may move in a direction toward the support structure 304 (e.g., downward in the perspective of FIG. 9). The resilient portions 348 of the planar spring element 340 may deform to allow such movement. A distance between the first electrode 318 and the second electrode 320 may increase, resulting in a measurable change in capacitance. When the force is released, the resilient portions 348 of the planar spring element 340 may return the second electrode 320 to an initial position relative to the first electrode 318. Likewise, the capacitance between the first and second electrodes 318, 320 may return to its initial value. As discussed above, the changes in capacitance may be measured to determine (e.g., estimate) a presence, location, and/or magnitude of the force applied to the first surface 306.

Figure 10:
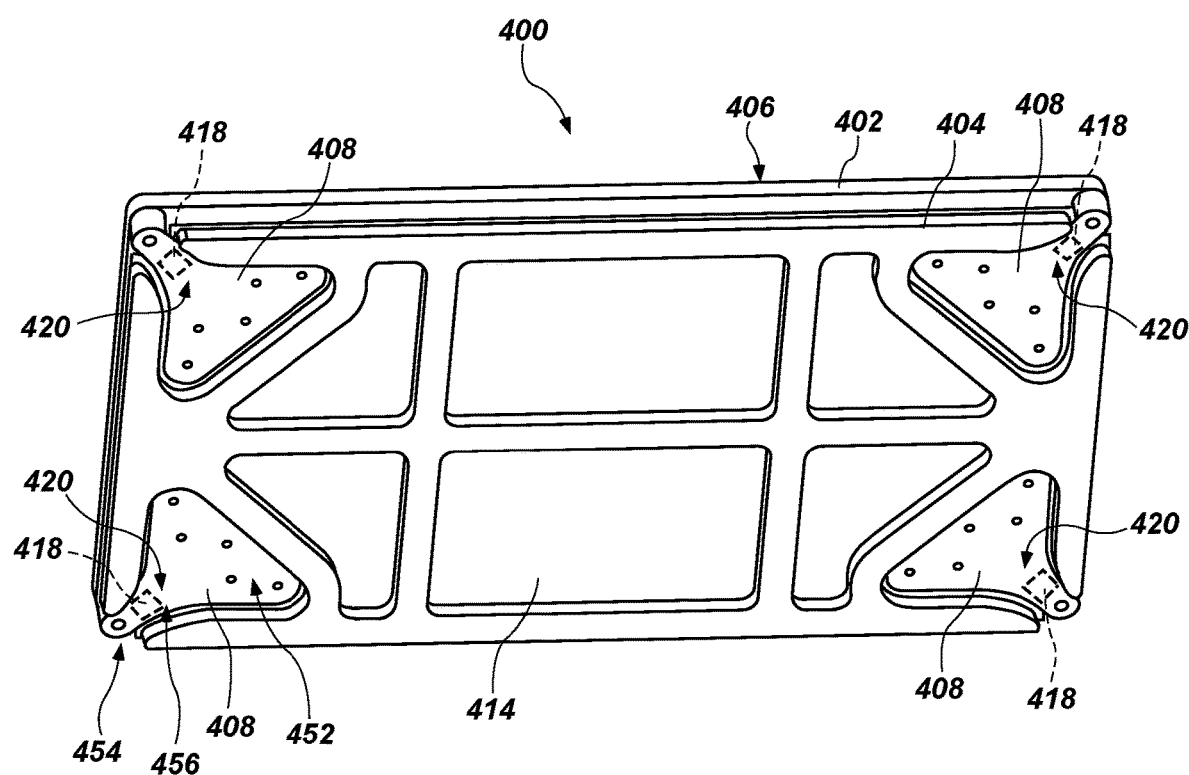
FIG. 10 is a bottom view of a system including capacitive force sensors according to another embodiment of this disclosure.

Referring to FIG. 10, another embodiment of a touch- and force-sensitive system 400 (also referred to simply as "system 400") is illustrated. The system 400 may be similar to the system 100 described above, in that the system 400 may include a chassis 402, a support structure 404 (e.g., including a PCB 414), and a first surface 406 (e.g., a touchpad, back plate, touchscreen, a side of a housing, an LCD screen including a touchscreen panel positioned thereon, etc.) of the chassis 402. The chassis 402 and the support structure 404 may be movable relative to each other. Proximate each corner of the system 400 may be a resilient mounting element 408. The resilient mounting elements 408 are, in the embodiment shown in FIG. 10, strip springs 408, but the strip springs 408 shown in FIG. 10 may be different than the strip springs 108 shown in FIG. 2. For example, each of the strip springs 408 of the embodiment shown in FIG. 10 may include an enlarged base section 452 for coupling to the PCB 414, an outer section 454 for coupling to the chassis 402 proximate a corner of the system 400, and a neck section 456 between the enlarged base section 452 and the outer section 454. The PCB 414 may include a first electrode 418 (shown in dashed lines in FIG. 10) and the neck section 456 of the strip spring 408 may include or be a second electrode 420.

The embodiment of the system 400 shown in FIG. 10 may operate in a similar manner to the embodiment of the system 100 described above.

One of ordinary skill in the art would recognize that embodiments of this disclosure have many benefits and advantages. For example, embodiments of this disclosure provide a robust and reliable capacitive force-sensitive solution that can be applied to various systems and products of potentially different sizes, masses, shapes, and configurations. The systems may be tailored to the needs of a particular user, such as to provide sensing of high or low forces. Embodiments may be relatively low cost to manufacture with a relatively low number of components that are cost-effective to manufacture or purchase. Embodiments can be applied to LCD touchscreen modules without impacting performance of the LCD touchscreen modules. By configuring the capacitors of the disclosed systems to generally open (i.e., the electrode portions moving apart from each other) when a force is applied, a greater range of force sensing may be possible compared to capacitors that close (i.e., the electrode portions moving toward each other) when a force is applied. This is because closing capacitors have an inherent limit, namely both electrode portions abutting against an insulator.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

Additional non limiting embodiments of the disclosure, include:

Embodiment 1

An assembly, comprising: a chassis comprising a first side configured to receive a force-sensitive surface; a support structure including first electrode portions; and resilient mounting elements attached to the chassis and to the support structure, the resilient mounting elements positioned to allow relative movement between the chassis and the support structure, wherein the resilient mounting elements comprise second electrode portions, the second electrode portions positioned adjacent to the first electrode portions.

Embodiment 2

The assembly of embodiment 1, wherein the resilient mounting elements comprise four strip springs respectively positioned near corners of the chassis.

Embodiment 3

The assembly according to any of embodiments 1 to 2, wherein the strip springs are oriented at an angle of about 45 degrees from a peripheral edge of the chassis.

Embodiment 4

The assembly according to any of embodiments 1 to 3, wherein the resilient mounting elements consist essentially of a metal material.

Embodiment 5

The assembly according to any of embodiments 1 to 4, wherein a gap is defined between each adjacent first electrode portion and second electrode portion when no external force is applied to the force-sensitive surface.

Embodiment 6

The assembly according to any of embodiments 1 to 5, further comprising biasing elements that, while a force is not applied to the first side of the chassis, are adapted to maintain the gaps defined between each adjacent first electrode portion and second electrode portion.

Embodiment 7

The assembly according to any of embodiments 1 to 6, wherein the gaps comprise air gaps.

Embodiment 8

The assembly according to any of embodiments 1 to 7, wherein a material is disposed in the gaps.

Embodiment 9

The assembly according to any of embodiments 1 to 8, wherein the resilient mounting elements are positioned to allow relative movement between each adjacent first electrode portion and second electrode portion.

Embodiment 10

The assembly according to any of embodiments 1 to 9, wherein an end portion of each of the resilient mounting elements is configured as a mounting point of the support structure to the chassis.

Embodiment 11

The assembly according to any of embodiments 1 to 10, wherein the support structure comprises a printed circuit board (PCB).

Embodiment 12

A method of estimating a force applied to a force-sensitive surface, the method comprising: detecting changes in capacitances of respective capacitors formed by first electrode portions on a support structure and second electrode portions defined by mounting elements, the mounting elements coupling a chassis receiving a force-sensitive surface to the support structure; using the detected changes in capacitances to determine a force value of a force applied to the force-sensitive surface; and comparing the changes in capacitances of the respective capacitors to estimate a location of the force applied to the force-sensitive surface.

Embodiment 13

A force-sensitive system, comprising: a chassis having a first side; force sensors comprising portions of a support structure and portions of a mounting element, the portions of the support structure and the portions of the mounting element adapted to move closer and/or apart responsive to one or more forces applied to the first side; a controller supported by the support structure and configured to identify the one or more forces applied to the first side by determining movement between the portions of the support structure and the portions of the mounting element.

Embodiment 14

The force-sensitive system of embodiment 13, wherein the controller is configured to detect capacitance changes of respective capacitors formed between the portions of the support structure and the portions of the mounting element upon movement of the mounting element relative to the support structure.

Embodiment 15

The force-sensitive system according to any of embodiments 12 to 14, wherein the controller is further configured to estimate a location of the one or more forces applied to the first side by comparing the detected capacitance changes of the respective capacitors.

Embodiment 16

The force-sensitive system according to any of embodiments 12 to 15, wherein the first side comprises a liquid crystal display touchscreen.

Embodiment 17

The force-sensitive system according to any of embodiments 12 to 16, further comprising at least one spacer positioned between the mounting element and the support structure to define an initial space between the portions of the mounting element and the portions of the support structure when the one or more forces is not applied to the first side.

Embodiment 18

The force-sensitive system according to any of embodiments 12 to 17, further comprising at least one biasing element positioned between the chassis and the support structure to bias the chassis to an initial position relative to the support structure when the one or more forces is not applied to the first side.

Embodiment 19

The force-sensitive system according to any of embodiments 12 to 18, further comprising insulators positioned between the portions of the mounting element and the portions of the support structure.

Embodiment 20

The force-sensitive system according to any of embodiments 12 to 19, wherein the mounting element comprises strip springs that are respectively attached to the support structure with at least one electrically conductive fastener.

Embodiment 21

The force-sensitive system according to any of embodiments 12 to 20, further comprising a protrusion between the chassis and the support structure, the protrusion configured to abut against a surface to limit relative movement between the chassis and the support structure when the one or more forces is of a sufficient value is applied to the first side.

Embodiment 22

A system, comprising: a surface; a controller coupled to the surface; and a force-sensitive device comprising the assembly of any according to any of embodiments 1 to 11.

Embodiment 23

The system of embodiment 22, wherein the force-sensitive device is configured to produce a force result responsive to an object touch at the surface.

Embodiment 24

The system according to any of embodiments 22 to 23, wherein the controller is configured to determine a force measurement responsive to the force result.

Embodiment 25

The system according to any of embodiments 22 to 24, wherein the controller is configured to determine a location at the surface responsive to the force result.

Embodiment 26

The system according to any of embodiments 22 to 25, further comprising a touch-sensitive device configured to produce a sense result responsive to an object touch at the surface or an object in close proximity to the surface.

Embodiment 27

The system according to any of embodiments 22 to 26, wherein the surface is selected from a group comprising: a touchscreen, a touchpad, a back plate, and a side of a housing.

What is claimed is:
1. An assembly, comprising:
a chassis comprising a first side configured to receive a force-sensitive surface;
a support structure including first electrode portions; and
resilient mounting elements attached to the chassis and to the support structure, the resilient mounting elements positioned to allow relative movement between the chassis and the support structure, wherein the resilient mounting elements comprise second electrode portions, the second electrode portions positioned adjacent to the first electrode portions.

2. The assembly of claim 1, wherein the resilient mounting elements comprise four strip springs respectively positioned near corners of the chassis.

3. The assembly of claim 2, wherein the strip springs are oriented at an angle of about 45 degrees from a peripheral edge of the chassis.

4. The assembly of claim 1, wherein the resilient mounting elements consist essentially of a metal material.

5. The assembly of claim 1, wherein a gap is defined between each adjacent first electrode portion and second electrode portion when no external force is applied to the force-sensitive surface.

6. The assembly of claim 5, further comprising biasing elements that, while a force is not applied to the first side of the chassis, are adapted to maintain the gaps defined between each adjacent first electrode portion and second electrode portion.

7. The assembly of claim 6, wherein the gaps comprise air gaps.

8. The assembly of claim 6, wherein a material is disposed in the gaps.

9. The assembly of claim 1, wherein the resilient mounting elements are positioned to allow relative movement between each adjacent first electrode portion and second electrode portion.

10. The assembly of claim 1, wherein an end portion of each of the resilient mounting elements is configured as a mounting point of the support structure to the chassis.

11. The assembly of claim 1, wherein the support structure comprises a printed circuit board (PCB).

12. A method of estimating a force applied to a force-sensitive surface, the method comprising:
detecting changes in capacitances of respective capacitors formed by first electrode portions on a support structure and second electrode portions defined by mounting elements, the mounting elements coupling a chassis receiving a force-sensitive surface to the support structure;
using the detected changes in capacitances to determine a force value of a force applied to the force-sensitive surface; and
comparing the changes in capacitances of the respective capacitors to estimate a location of the force applied to the force-sensitive surface.

13. A force-sensitive system, comprising:
a chassis having a first side;
force sensors comprising portions of a support structure and portions of a mounting element, the portions of the support structure and the portions of the mounting element adapted to move closer and/or apart responsive to one or more forces applied to the first side; and
a controller supported by the support structure and configured to identify the one or more forces applied to the first side by determining movement between the portions of the support structure and the portions of the mounting element.

14. The force-sensitive system of claim 13, wherein the controller is configured to detect capacitance changes of respective capacitors formed between the portions of the support structure and the portions of the mounting element upon movement of the mounting element relative to the support structure.

15. The force-sensitive system of claim 14, wherein the controller is further configured to estimate a location of the one or more forces applied to the first side by comparing the detected capacitance changes of the respective capacitors.

16. The force-sensitive system of claim 13, wherein the first side comprises a liquid crystal display touchscreen.

17. The force-sensitive system of claim 13, further comprising at least one spacer positioned between the mounting element and the support structure to define an initial space between the portions of the mounting element and the portions of the support structure when the one or more forces is not applied to the first side.

18. The force-sensitive system of claim 13, further comprising at least one biasing element positioned between the chassis and the support structure to bias the chassis to an initial position relative to the support structure when the one or more forces is not applied to the first side.

19. The force-sensitive system of claim 13, further comprising insulators positioned between the portions of the mounting element and the portions of the support structure.

20. The force-sensitive system of claim 13, wherein the mounting element comprises strip springs that are respectively attached to the support structure with at least one electrically conductive fastener.

21. The force-sensitive system of claim 13, further comprising a protrusion between the chassis and the support structure, the protrusion configured to abut against a surface to limit relative movement between the chassis and the support structure when the one or more forces is of a sufficient value is applied to the first side.

22. A system, comprising:
a force-sensitive surface;
a controller coupled to the force-sensitive surface; and
a mounting assembly, the mounting assembly comprising:
a chassis comprising a first side configured to receive the force-sensitive surface;
a support structure including first electrode portions; and
resilient mounting elements attached to the chassis and to the support structure, the resilient mounting elements positioned to allow relative movement between the chassis and the support structure, wherein the resilient mounting elements comprise second electrode portions, the second electrode portions positioned adjacent to the first electrode portions.

23. The system of claim 22, wherein the force-sensitive device is configured to produce a force result responsive to an object touch at the surface.

24. The system of claim 23, wherein the controller is configured to determine a force measurement responsive to the force result.

25. The system of claim 23, wherein the controller is configured to determine a location at the surface responsive to the force result.

26. The system of claim 22, further comprising a touch-sensitive device configured to produce a sense result responsive to an object touch at the surface or an object in close proximity to the surface.

27. The system of claim 22, wherein the surface is selected from a group comprising: a touchscreen, a touchpad, a back plate, and a side of a housing.

* * * * *